United States Patent [19]

Araki et al.

[11] 4,205,433
[45] Jun. 3, 1980

[54] ELECTRIC PART INSERTION METHOD AND APPARATUS

[75] Inventors: Shigeru Araki; Kazuhiro Mori, both of Katano; Kiyoshi Mayahara, Kadoma; Yoshihiko Misawa, Katano, all of Japan

[73] Assignee: Matsushita Electric Industrial Co., Ltd., Osaka, Japan

[21] Appl. No.: 867,350

[22] Filed: Jan. 5, 1978

[30] Foreign Application Priority Data

Jan. 12, 1977 [JP] Japan .................................. 52-2748

[51] Int. Cl.² .............................................. H05K 3/32
[52] U.S. Cl. ........................................ 29/837; 29/741;
29/564.6; 29/564.8; 29/566.2; 227/85
[58] Field of Search ............. 29/626, 417, 33 S, 33 K, 29/33 Q, 566.1, 566.2, 566.3, 739, 741, 564.6, 564.7, 564.8; 140/105, 1; 72/DIG. 10; 227/85, 86, 82, 110

[56] References Cited

U.S. PATENT DOCUMENTS

| | | | |
|---|---|---|---|
| 2,748,388 | 6/1956 | Cardani | 29/566.3 |
| 3,488,672 | 1/1970 | Martyn | 29/741 |
| 3,577,847 | 5/1971 | Scranton | 29/741 |
| 3,593,404 | 7/1971 | Ragard | 29/566.1 |
| 3,594,889 | 7/1971 | Clark | 29/741 |
| 3,597,824 | 8/1971 | Yoshida et al. | 29/741 |
| 3,783,488 | 1/1974 | Ragard et al. | 29/741 |
| 4,051,593 | 10/1977 | Mori et al. | 29/741 |

Primary Examiner—Daniel C. Crane
Attorney, Agent, or Firm—Burgess, Ryan and Wayne

[57] ABSTRACT

Detachably mounted on a sliding table are a plurality of part tape or belt feed units each of which intermittently feeds to a lead wire cutting station a part tape or belt holding a large number of parts of the same type, each of which has lead wires extended in opposite directions and coaxially of a main body of the part and attached adjacent to their ends to parallel strips of tape or belt in equidistantly spaced apart relationship with the lead wires of the adjacent parts. The sliding table moves in either direction so that the desired part tape or belt feed unit is moved to a part feed position at which the desired part tape or belt feed unit feeds the part to the cutting station. At the cutting station a cutter unit cuts off from the part tape or belt the lead wires of the part, thereby separating therefrom the part having lead wires of a predetermined length, and the lead wires are bent in the same direction. Thereafter the cutter unit is rotated and moved to a lead wire insertion position, and a pusher in the cutter unit pushes the shoulder portions of the lead wires so as to insert them into predetermined apertures in a printed circuit board. The lead wires of parts of any sizes and configurations may be inserted, and the cutter unit effects the cutting, forming and pushing toward the insertion position of the lead wires, whereby the lead wire insertion speed may be substantially increased.

8 Claims, 28 Drawing Figures

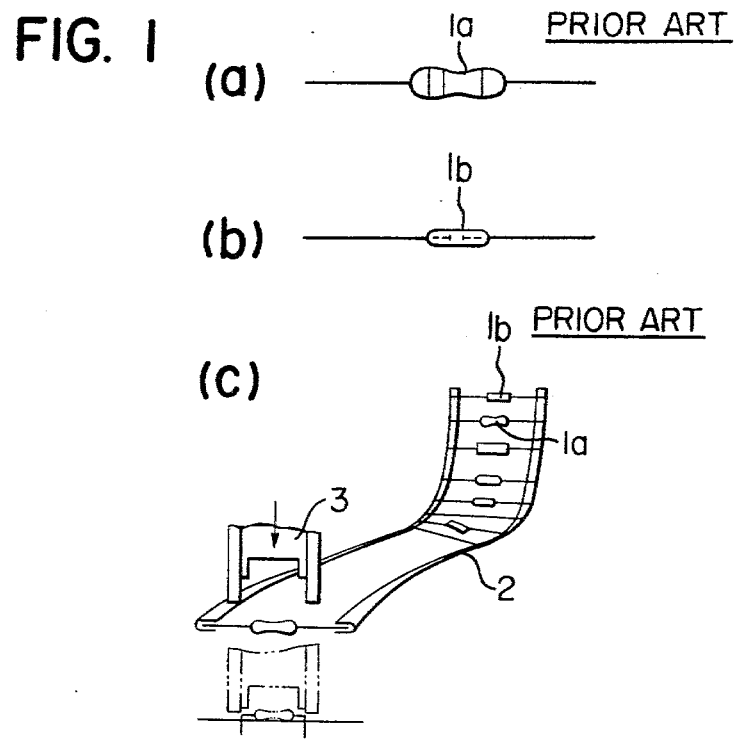
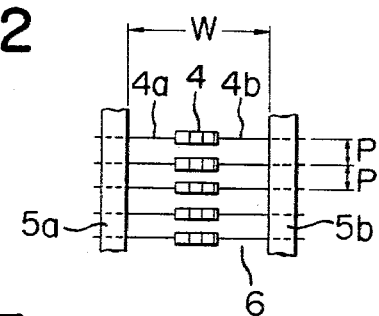
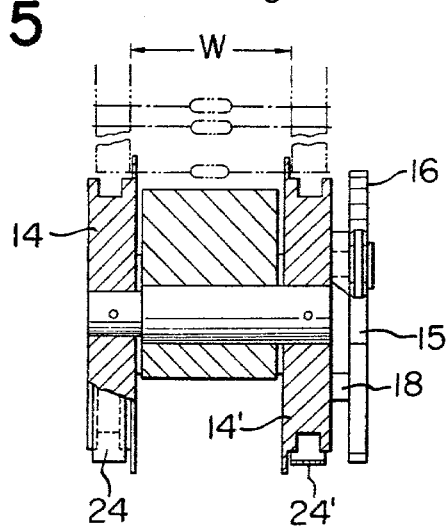

| FIG. 3A | FIG. 3B |

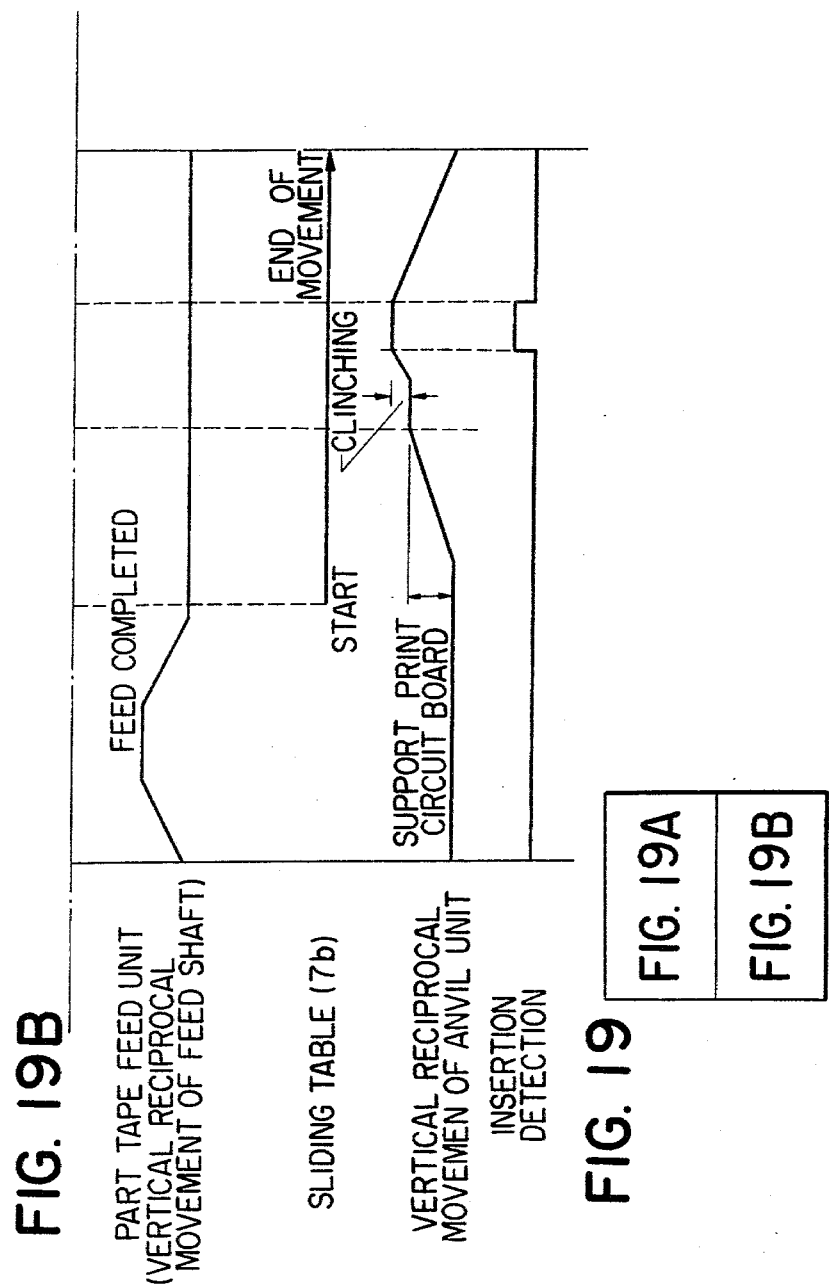

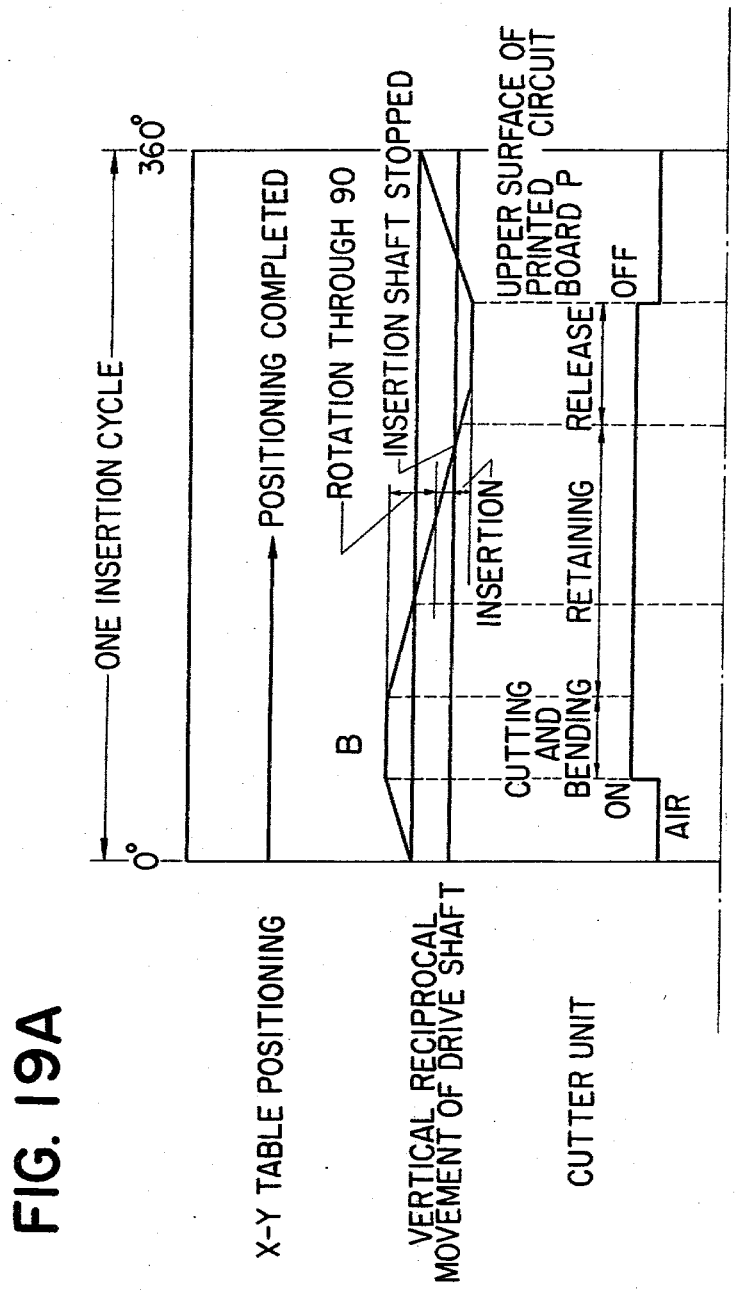

ELECTRIC PART INSERTION METHOD AND APPARATUS

BACKGROUND OF THE INVENTION

The present invention relates to a method and apparatus for effecting the automatic insertion into predetermined apertures in a printed circuit board the lead wires of electric and electronic parts such as resistors and diodes, the lead wires being extended in opposite directions coaxially of a main body of a part.

In general, the prior art part insertion methods and apparatus may be divided into two types. According to one type, various types of parts are previously arrayed on a tape or belt in a predetermined insertion sequence, and such a tape or belt is directly fed to a lead wire insertion head so that the leads of the parts may be sequentially inserted into predetermined apertures in a printed circuit board according to a predetermined electric device arrangement pattern. Since the parts are attached to the tape or belt in a predetermined insertion sequence, when a failure in insertion of the lead wires of one part occurs, the insertion cycle of this part cannot be repeated.

According to the other type, there are prepared a plurality of part tapes or belts each holding a large number of parts of the same type. The desired tape or belt is selected, and a part is separated therefrom and transferred on a belt or through a pipe to an insertion head which effects the insertion of the lead wires of the part into predetermined apertures in a printed circuit board. Since the parts separated from the part tapes or belts are transferred through a pipe or on a conveyor belt, they are rotated or inclined so that the stable transfer to the insertion head cannot be ensured. Furthermore the transfer takes a long time so that the insertion cycle time cannot be shortened. Moreover the parts are damaged and the lead wires are deformed during the transfer.

In order to improve the above second-mentioned type of insertion apparatus, we have previously invented an arrangement for inserting electric parts into the apertures of a printed circuit board by grasping the parts with a chuck one by one (see U.S. Pat. No. 4,051,593). The problem of the second type of insertion apparatus was solved by this arrangement, but this construction is complicated, because the cut electrical part is horizontally rotated and transmitted and rectangularly and vertically rotated by the chuck.

SUMMARY OF THE INVENTION

Accordingly, one of the objects of the present invention is to provide an electric part insertion method and apparatus wherein there is prepared a part tape or belt holding a large number of parts of the same type each of which has lead wires extended in opposite directions from and coaxially of a main body of the part and attached adjacent to their ends to a pair of parallel strips of tape or belt; at a lead wire cutting position a cutter unit cuts off from the part tape or belt the lead wires of the part, thereby separating from the part tape or belt the part having the lead wires of a predetermined length, and bends the cut off lead wires in the same direction; and the cutter unit is moved from the cutting position to a lead wire insertion position where the lead wires are inserted into predetermined apertures in a printed circuit board, whereby the lead wire insertion cycle may be considerably shortened.

Another object of the present invention is to provide a part insertion method and apparatus wherein the lead wires of the part are retained so firmly when the cutter unit is moved from the cutting position to the insertion position that the lead wires may be securely held in position during the high speed cutting, lead wire forming or bending and insertion.

A further object of the present invention is to provide a part insertion method and apparatus wherein only the lead wires of the electric part are clamped or pushed when the part is separated from the part tape or belt and the lead wires are bent and inserted into the apertures of the printed circuit board so that no force is exerted to the main body of the part and consequently the damages to the main body may be avoided.

A further object of the present invention is to provide an electric a part insertion apparatus wherein a suitable cutter head may be detachably mounted on an insertion head so that the insertion of lead wires may be effected even when the apertures of the printed circuit boards vary in pitch only by the replacement of the cutter unit.

A further object of the present invention is to provide an electric part insertion method and apparatus wherein a lead wire forming means is formed with guide grooves in which are retained the bent lead wires and through which are guided the lead wires to the insertion position, and a pusher which pushes the shoulder portions of the bent lead wires when inserted is formed with guides which are slidably fitted into the guide grooves of the lead wire forming means so that as the guides slip through the guide grooves any foreign matters therein are ejected out of it and the correct bending and guide of the lead wires may be ensured.

A further object of the present invention is to provide an electric part insertion method and apparatus wherein male cutters having a suitable thickness may be detachably mounted on the lead wire forming means so that the lead wires may be cut into a desired length, and when the lead wires are formed or bent, the lead wire forming means is advanced beyond the leading ends of the make cutters so that the male cutters are prevented from striking against the printed circuit board and the parts already mounted thereon, thereby damaging them and that the parts may be mounted on the printed circuit board at an increased packaging density.

A further object of the present invention is to provide a part insertion method and apparatus wherein a plurality of part tapes or belts each holding parts of one type are prepared and mounted on a slidable table or the like which moves in either direction to bring the desired part tape or belt to the cutting position so that various types of parts may be mounted on a single printed circuit board it is not need to prepare a part tape or belt holding various types of parts in a predetermined sequence and the insertion efficiency may be much improved.

A further object of the present invention is to provide a part insertion method and apparatus wherein the lead wires inserted into the apertures in the printed circuit board are clinched against the undersurface thereof so that the parts mounted on the printed circuit board may be prevented from falling therefrom when the printed circuit board is transferred to the next processing station.

A further object of the present invention is to provide means for detecting whether or not the lead wires are inserted into the predetermined apertures in the printed circuit board so that the misinsertion may be avoided and that when the misinsertion is detected the insertion cycle of a part of the same type may be repeated, whereby the misinsertion may be completely eliminated.

A further object of the present invention is to employ a numerical control system in a printed circuit board positioning device so that desired apertures of the printed circuit board may be quickly and correctly brought to the insertion position.

A further object of the present invention is to provide a part insertion method and apparatus wherein a rack and pinion mechanism is used for moving the cutter unit between the cutting position and the insertion position, a stopper is provided for engagement with the cutter unit so that the unit may be firmly held in the insertion position, and a drive shaft is extended through the insertion head for vertical reciprocal movement which in turn causes the movements of the rack and the pusher in the cutter unit so that jolting and displacement of the cutter unit may be prevented during the insertion step and consequently the correct insertion may be ensure.

To the above and other ends, the present invention provides a part insertion apparatus comprising a part tape or belt holding a large number of parts of the same type each of which has lead wires extended in the opposite directions from and coaxially of a main body of the part and attached adjacent to their ends to a pair of parallel strips of tape or belt in equidistantly spaced apart relationship with the lead wires of the adjacent parts, a part tape or belt feed unit for effecting the intermittent feed of the part tape or belt so that the parts may be brought to a lead wire cutting position one by one, a cutter unit which is movable between the cutting position and a lead wire insertion position where the lead wires of the part are inserted into predetermined apertures in a printed circuit board and which cuts off from the tape or belt the lead wires of the part, thereby separating from the tape or belt the part having the lead wires of a predetermined length, and bends the lead wires in the same direction, a lead wire insertion head which includes a pushing means for pushing the bent wires toward the printed circuit board when the cutter unit is brought to the insertion position, and a printed circuit board positioning device which supports the printed circuit board and moves it in the X- and Y-directions so that the predetermined apertures may be brought to the insertion position.

BRIEF DESCRIPTION OF THE DRAWINGS

FIG. 1(a) shows a resistor;
FIG. 1(b) shows a diode;
FIG. 1(c) is a schematic view used for the explanation of a prior art part insertion method;
FIG. 2 shows a part tape or belt holding a large number of parts of the same type and used in the present invention;
FIGS. 3A and 3B consitute a perspective view of a part insertion apparatus in accordance with the present invention while
FIG. 3 shows the interrelationship between FIGS. 3A and 3B;
FIG. 5 is a vertical sectional view thereof;
FIG. 19 is a timing diagram of the insertion cycle accomplished by the part insertion apparatus in accordance with the present invention.

DESCRIPTION OF THE PREFERRED EMBODIMENT

Prior Art

Figures 3, 3A:
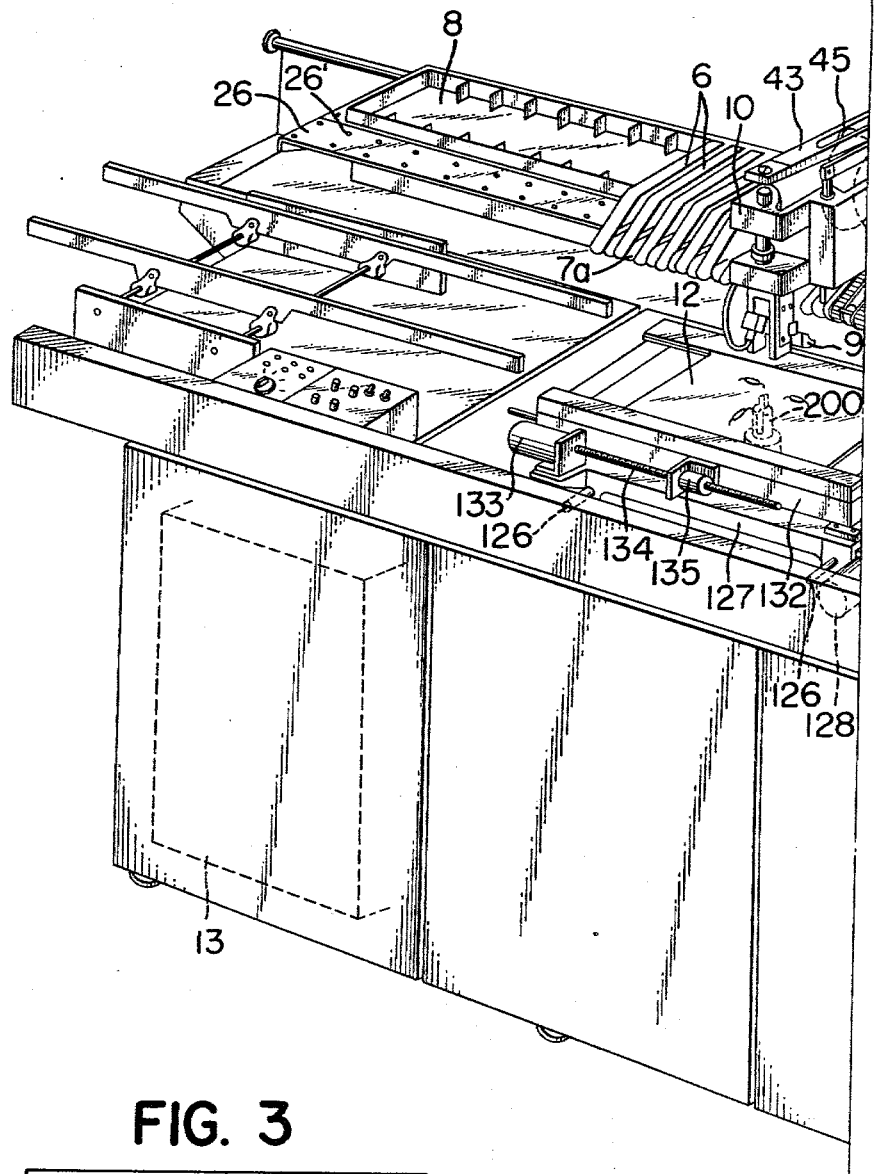
Figure 3B:
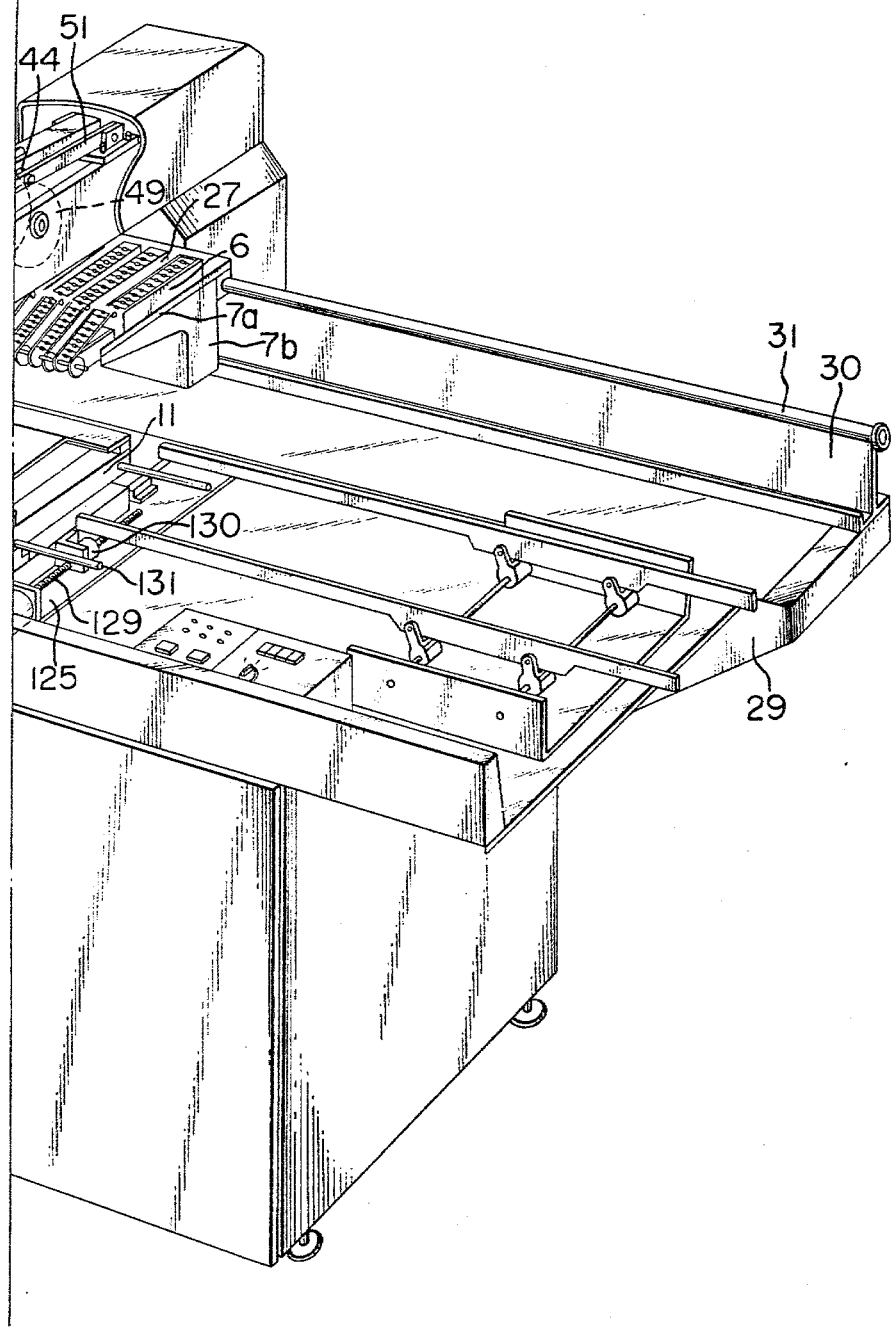
Figure 4:
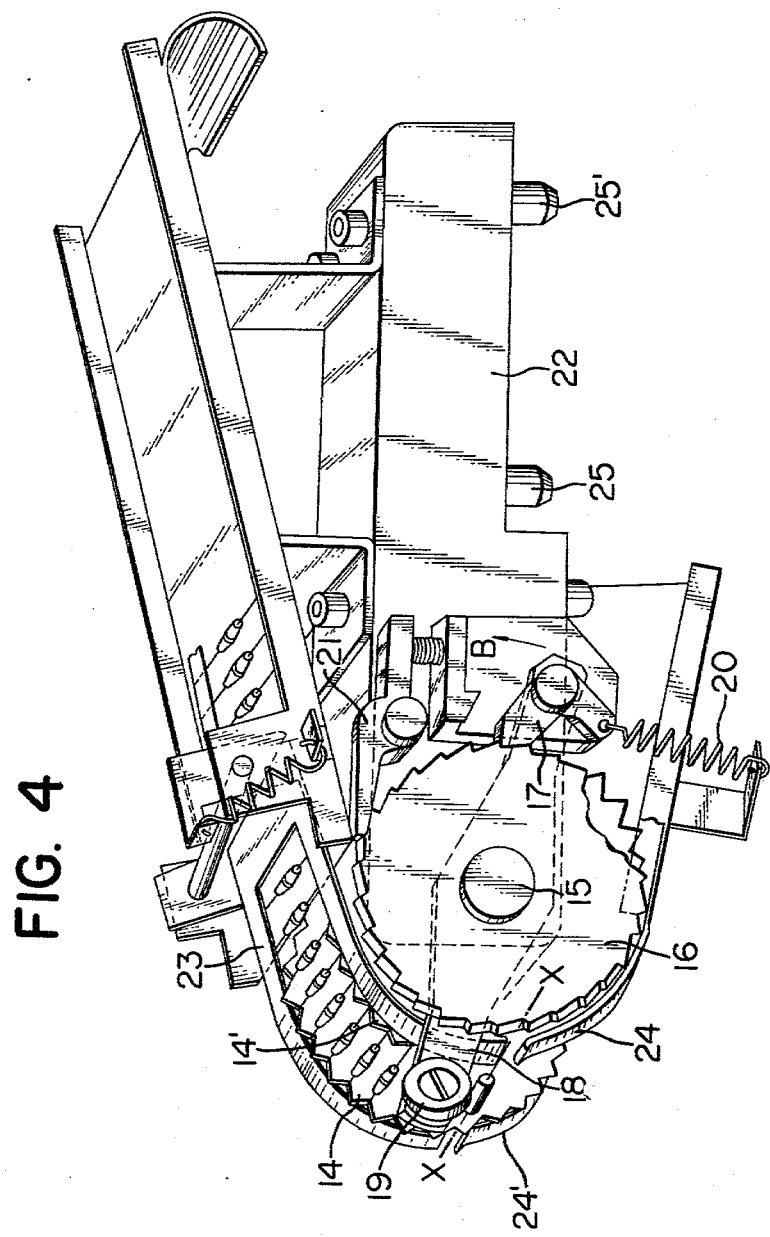
FIG. 4 is a perspective view of a part tape or belt feed unit.
Figure 6:
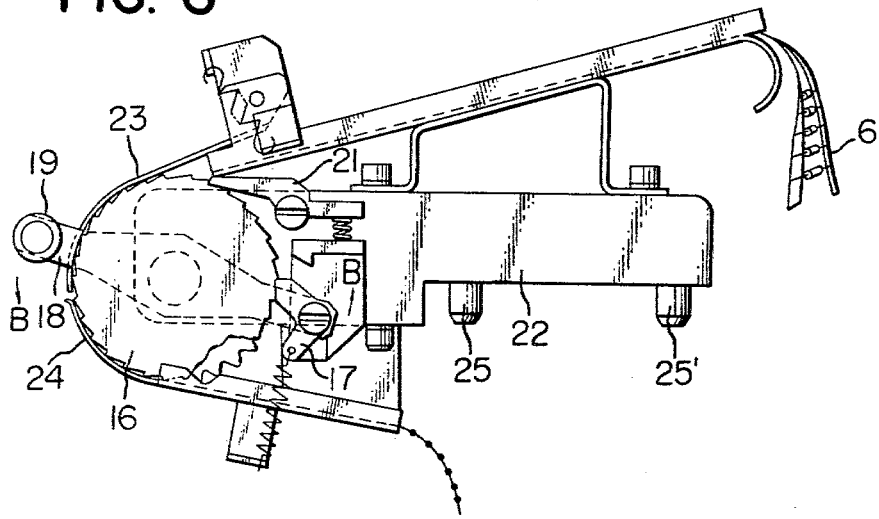
FIG. 6 is a side view thereof.
Figure 7:
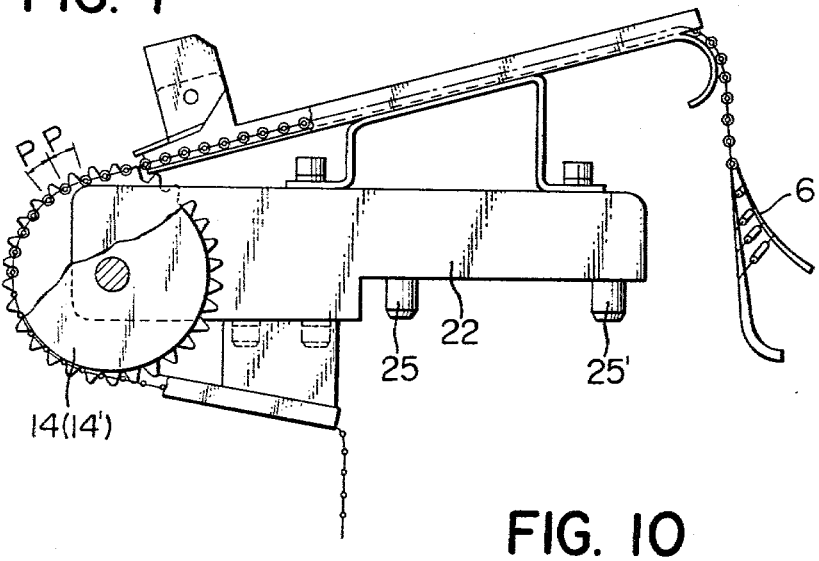
FIG. 7 is a longitudinal sectional view thereof.

Prior to the description of the preferred embodiment of the present invention, a prior art method and apparatus for assembling electric components will be briefly described. Referring to FIG. 1, electrical parts such as resistors 1a and diodes 1b must be assembled in a predetermined sequence, and an assembly 2 of these parts is fed directly to an insertion head 3 so that the parts are sequentially inserted into predetermined apertures of a printed circuit board and clinched. Since the parts to be assembled are previously assembled in the form of a tape or belt 2 according to a predetermined insertion sequence, the part insertion sequence cannot be altered so that when the insertion head 3 makes a failure in insertion, this failure cannot be remedied.

The Invention

In FIG. 2 there is shown a belt or tape 56 of electric components 4 of the same type. Lead wires 4a and 4b extended coaxially of the main bodies 4 are attached to a pair of parallel flexible tapes or the like 5a and 5b in equally spaced apart relationship.

In FIG. 3 there is shown an electric component assembling apparatus in accordance with the present invention having a movable part feed station, a part insertion head including a cutter unit 9, a board positioning device 11 for supporting a printed circuit board 12 and moving it in the X- and Y-directions so that predetermined apertures in the printed circuit board may be brought to the insertion position immediately below the insertion head, an anvil unit 200 for clinching the inserted lead wires to the printed circuit board and for detecting the insertion of the lead wires into the predetermined apertures and a drive-control unit 13 for driving and controlling the movable part feed station, the insertion head 10, the board positioning device 11 and so on.

The movable part feed station includes a sliding table or bed 7b slidable along a guide 31, a part box holder 8 mounted on the table 7b for holding a plurality of part boxes 27 (See FIG. 8) each containing the tape or belt 6 of the same components 4, and a plurality of tape feed units 7a mounted in parallel on the table 7b each for feeding the component tape or belt 6 to the insertion head 10 from the part box 27 when the movable part feed station is traversed so that the desired part feed unit 7a is in line with the insertion head 10.

When an electric component 4 is fed to the cutter unit 9, the cutter unit 9 cuts the lead wires 4a and 4b from the tapes 5a and 5b, molds the lead wires 4a and 4b into a predetermined form and inserts them into predetermined apertures in the printed circuit board 12 as will be described in detail hereinafter.

Movable Part Feed Station

Referring to FIGS. 4–7, the tape feed units 7a detachably mounted on the movable part feed station are similar in construction and mode of operation. The tape feed unit 7a includes a support 22 having two pins 25 and 25' extended downward from the undersurface of the support 22 for engagement with mounting holes 26 and 26' in the table 7b (See FIG. 3). A shaft 15 which is rotatably mounted on the support 22 carries axially spaced toothed feed wheels 14 and 14' and a driving ratchet wheel 16 all having the same tooth pitch P which is determined depending upon a desired feed distance of the part tape 6. The toothed feed wheels 14 and 14' are spaced apart from each other in the axial direction by a distance slightly smaller than the width W of the part tape 6 (See FIG. 2). The driving ratchet wheel 16 engages with two pawls 17 and 21. The pawl 17 which is a driving pawl is attached to one end of a lever 18 which is pivoted with the shaft 15 to the support 22 and the other end of which carries a roller 19 which serves to reduce the frictional resistance encountered by the lever 18. A return spring 20 attached to the lever 18 also serves to keep the pawl 17 pressed against the driving ratchet wheel 16. The other pawl 21 which is an arresting pawl is pivoted with a pin to the support 22 and is biased by a spring. The arresting pawl 21 is correctly timed with the toothed feed wheels 14 and 14' and the driving ratchet wheel 16 so that when the arresting pawl 21 arrests the driving ratchet wheel 16, one component 4 on the part tape 6 may be correctly brought to and held at a predetermined feed line X—X at which the lead wires 4a and 4b are cut off from the tapes 5a and 5b by the cutter unit 9 as will be described in detail hereinafter. In order to ensure the positive engagement with the lead wires 4a and 4b of the components 4 with the teeth of the toothed feed wheels 14 and 14', curved guard plates 23, 24 and 24' are attached along the paths of the tapes 5a and 5b.

Upon one stepwise rotation in the direction B of the ratchet wheel 16, the toothed feed wheels 14 and 14' are also rotated stepwise through the pitch P, whereby the components 4 are brought to the feed line X—X one by one.

Figure 8:
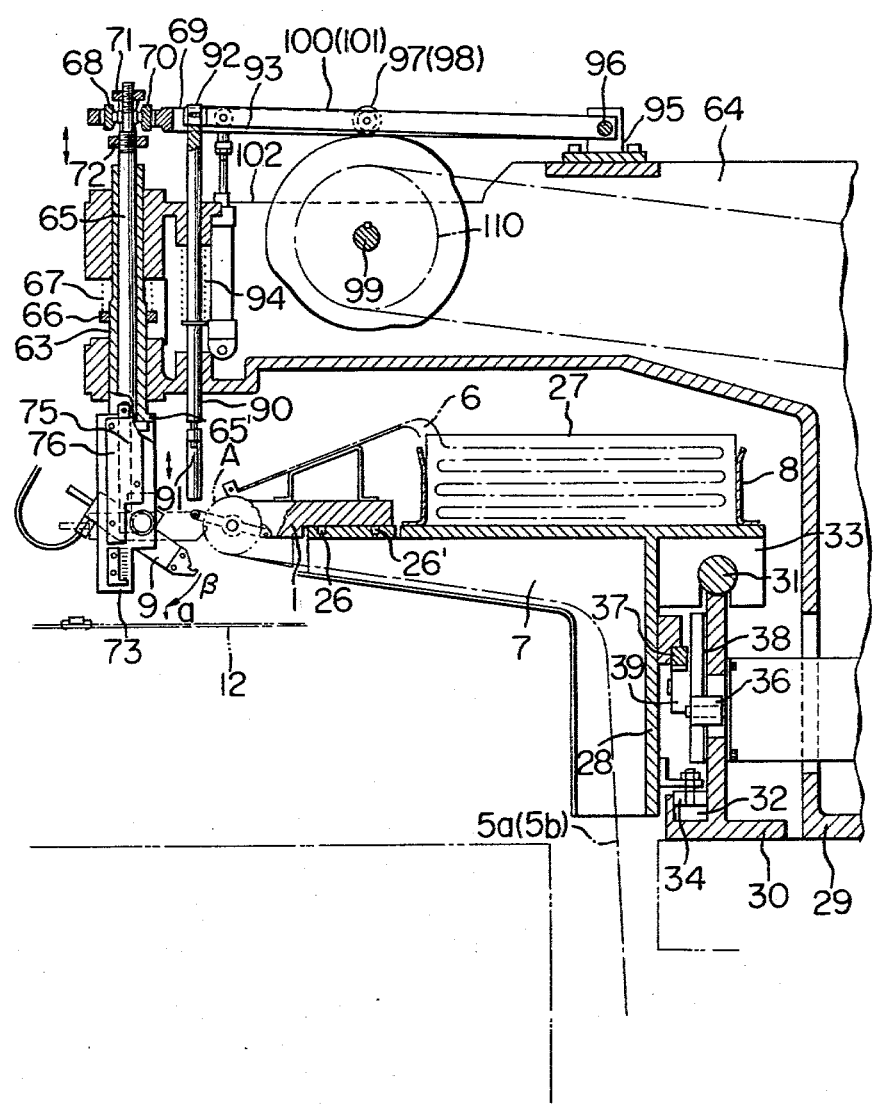
FIG. 8 is a fragmentary sectional view of the part insertion apparatus illustrating the upper portion thereof.
Figure 9:
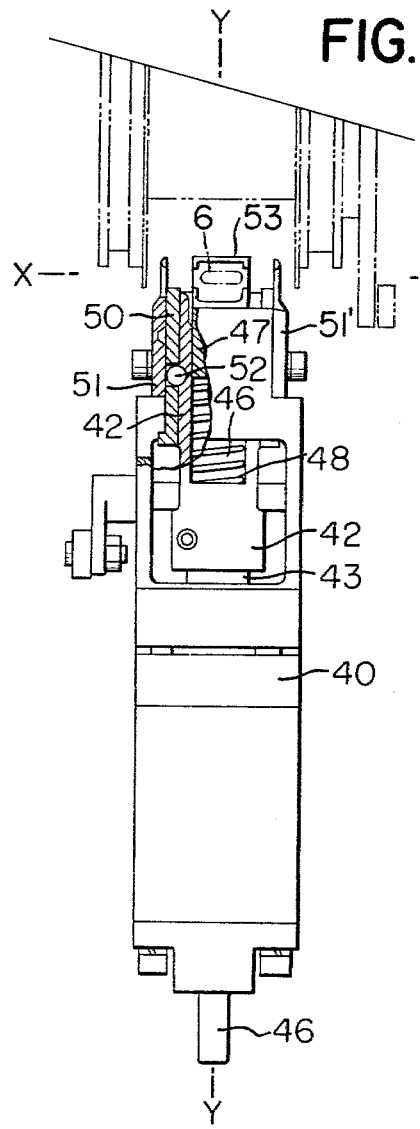
FIG. 9 is a top view of a cutter unit.

As described above, a desired number of the part tape feed units 7a with the construction described above may be mounted on the sliding table 7b. Referring particularly to FIG. 8, the construction of the sliding table 7b will be described in detail. A rail 30 is mounted lengthwise on a main frame 29 of the apparatus and has a guide roller groove 32 on the side of a vertical frame 28 of the sliding table 7b. A plurality of lengthwise spaced apart sliding bearing blocks 33 are securely attached to the undersurface of the sliding table 7b and are slidably fitted over the guide rod 31 securely attached to or integrally formed with the top of the rail 30. A plurality of cam follower rollers 34 are attached with brackets to the vertical frame 28, spaced apart from each other by a suitable distance and fitted into the guide groove 32 of the rail 30. A rack 37 which is mounted lengthwise on the vertical frame 28 of the sliding table 7b is in mesh with a first idle gear 39 which in turn is in mesh with a second idle gear 38 in mesh with a pinion 36 attached to the drive shaft of a pulse motor 35 mounted on the rail 30. Therefore upon rotation of the pulse motor 35, the sliding table 7b is moved lengthwise in either direction along the guide rod 31 and the guide groove 32 so that the desired part tape feed unit 7a may be brought to and held at the feeding position to the insertion head 10.

Tape scraps 4' and 5' separated from the components 4 are discharged by their own gravity as indicated by the one-dot chain line.

Cutter Unit 9

Figure 10:
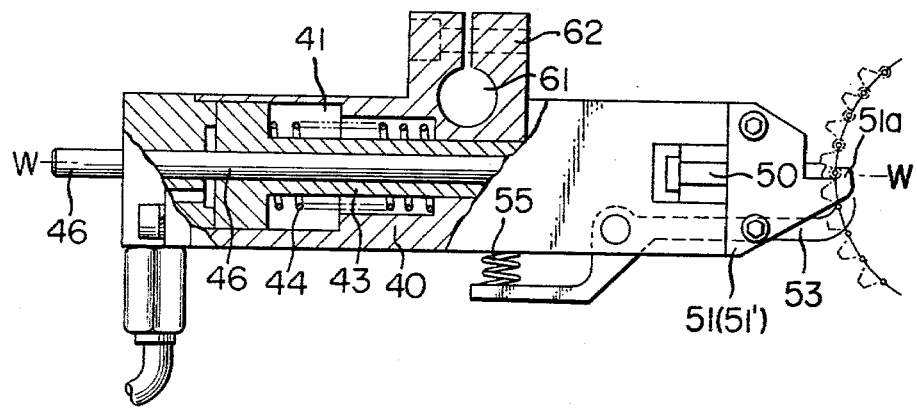
FIG. 10 is a side view, partly in section, thereof.

Referring to FIGS. 9–12, the cutter unit 9 has a main body 40 which defines a cylinder bore 41 (See FIG. 10) into which is slidably fitted a piston 43 having a piston rod the free end of which is terminated into a lead wire forming member 42. As best shown in FIG. 10, the piston 43 is biased by a compression spring 44 loaded in the cylinder bore 41. U- or V-shaped grooves 45 and 45' are formed in the opposed walls of the free end portion of the lead wire forming member 42 in line with the axis W—W (See FIG. 10). The distance between the bottoms of the opposed U- or V-shaped grooves 45 and 45' is equal to an insertion pitch q; that is, the distance between the apertures of the printed circuit board 12 into which are inserted the lead wires 4a and 4b of the component 4. A pusher rod 46 is extended through the piston 43 coaxially thereof, and a pusher 47 (See FIG. 11(c)) is attached to one end of the pusher rod 46, and a bias compression spring 48 is loaded between the free end of the piston rod 43 and the pusher 47. The forward stroke of the pusher 47 is limited by a stopper 49 (See FIG. 12) attached to or formed integral with the lead wire forming member 42. Channel-shaped grooves are formed in the exterior wall of the lead wire forming member 42 adjacent the free end thereof for permitting the slidable movement of male cutters 50 and 50' to be described below.

The female cutters 51 and 51' which are attached to the main body 40 have cutter blades 51a and 51'a and cooperate with the male cutters 50 and 51, respectively, to cut off the lead wires 4a and 4b from the tapes 5a and 5b. The male cutters 50 and 50' are selectively coupled to the mating female cutter 51 and 51' or to the lead wire forming member 42 through steel balls 52 and 52' fitted into holes formed in the male cutters 50 and 50' intermediate the ends thereof and selectively engaged with recesses semicircular in cross section formed in the exterior wall of the lead wire forming member 42 or in the interior surfaces of the female cutters 51 and 51'.

The male cutters 50 and 50' are normally coupled to the lead wire forming member 42.

Figure 14:
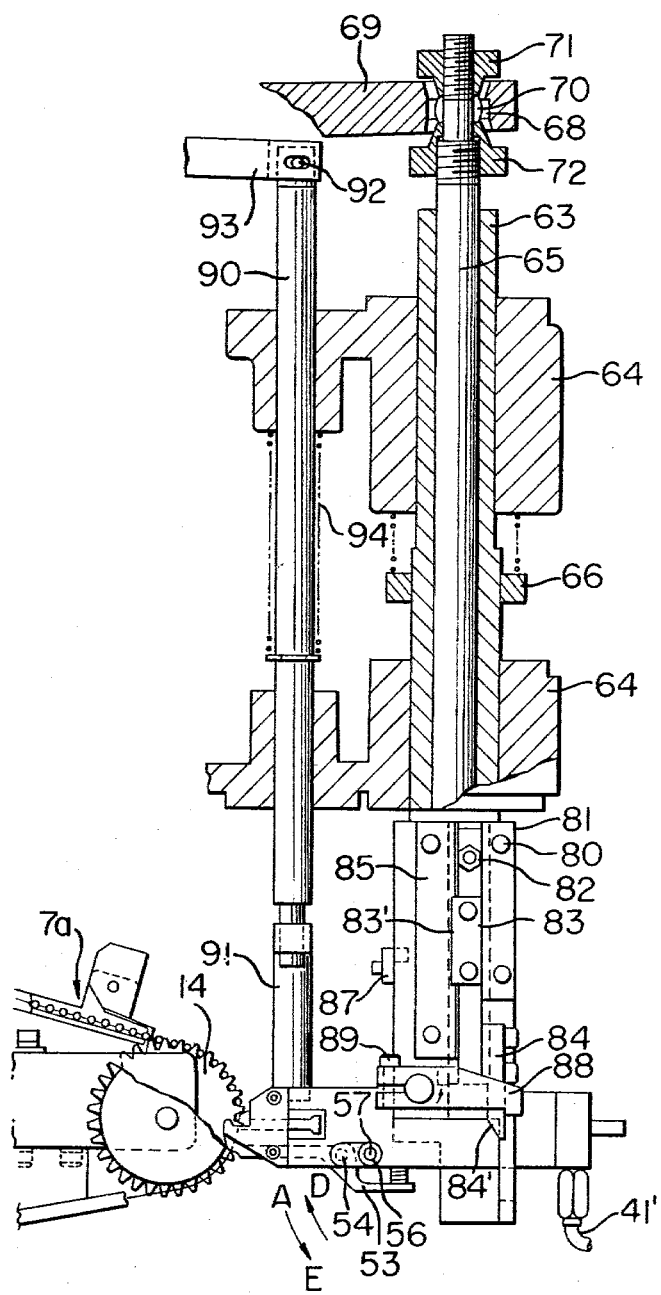
FIG. 14 is a side view, partly in section, thereof.

One end of a lead wire holding lever 53 which is pivoted with a pin 54 to the main body 40 is terminated into a lead holding member 53', and a compression spring 55 is loaded between the other end of the lever 53 and the main body 40. A roller 56 is rotatably attached with a pin 57 to a lever the other end of which is pivoted to the pin 54 (See FIG. 14).

Next the mode of operation of the cutter unit 9 will be described. At the cutting position A, the feed line X—X and the axis Y—Y (the center line of the male and female cutters) are coplanar (See FIGS. 9 and 10). When air is forced through an air supply hose 41' (See FIG. 13) into the cylinder bore 41, the piston 43 and the lead wire forming member 42 are advanced. The pusher 47 at the free end of the piston rod 43 and the male cutters 50 and 50' which are coupled through the balls 52 and 52' to the lead wire forming member 42 are also advanced. Therefore the lead wires 4a and 4b of the component 4 are retained between the lead wire holding member 53' of the holding lever 53 and lead wire retaining ends of the pusher 47. Since the forward stroke of the pusher 47 is limited by the stopper 49 and the compression spring 55 biasing the holding lever 53 is stronger than the compression spring 48 biasing the pusher 47, the pusher 47 is held in lead wire retaining relationship with the lead wire holding member 53' at the end of the holding lever 53 (See FIG. 12).

The male and female cutters 50, 50', 51 and 51' move toward each other, thereby cutting off the lead wires 4a and 4b of the component 4 from the tapes 5a and 5b. The male cutters 50 and 50' are advanced until the stepped portions or projections 58 and 58' at the rear ends of the male cutters 50 and 50' engages with the rear ends or stoppers 59 and 59' of the female cutters 51 and 51'. In this position, the balls 52 and 52' drop into the semicircular recesses 60 and 60' in the female cutters 51 and 51' as shown in FIG. 11, the male cutters 50 and 50' are released from the lead wire forming member 42, and the lead wire forming member 42 is further advanced until the piston 43 reaches its forward stroke limit (See FIG. 11) so that the lead wires 4a and 4b of the component 4 are bent by the holding member 53' of the holding lever 53 and advanced in the U- or V-shaped guide grooves 45 and 45' of the lead wire forming member 42.

In summary, when the air is forced into the cutter unit 9, the component 4 on the part tape or belt 6 if separated from the belt 6, and the lead wires 4a and 4b of the component are formed into a predetermined shape and remains in this shape.

Figure 11B:
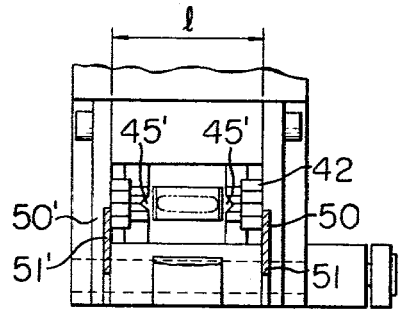
FIG. 11(b) is a front view thereof.
Figure 11C:
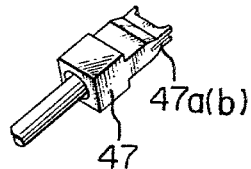
FIG. 11(c) is a perspective view of a pusher of the cutter unit.
Figure 11A:
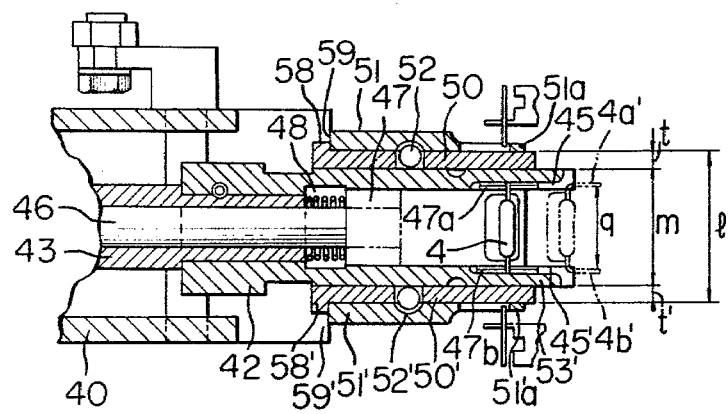
FIG. 11(a) is a longitudinal sectional view thereof.
Figure 12:
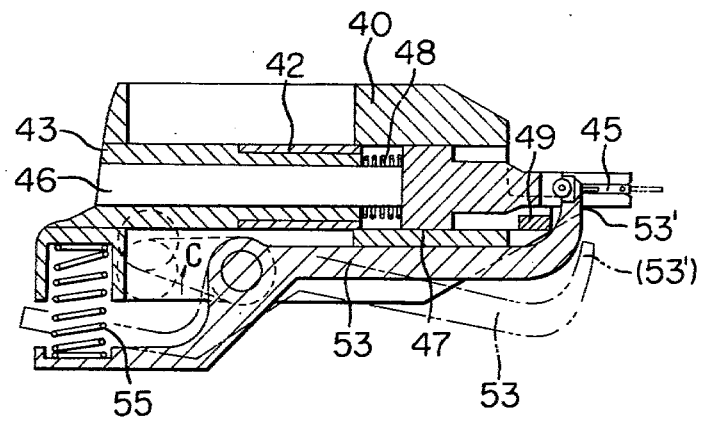
FIG. 12 is a fragmentary sectional view, on enlarged scale, of the cutter unit.
Figure 13:
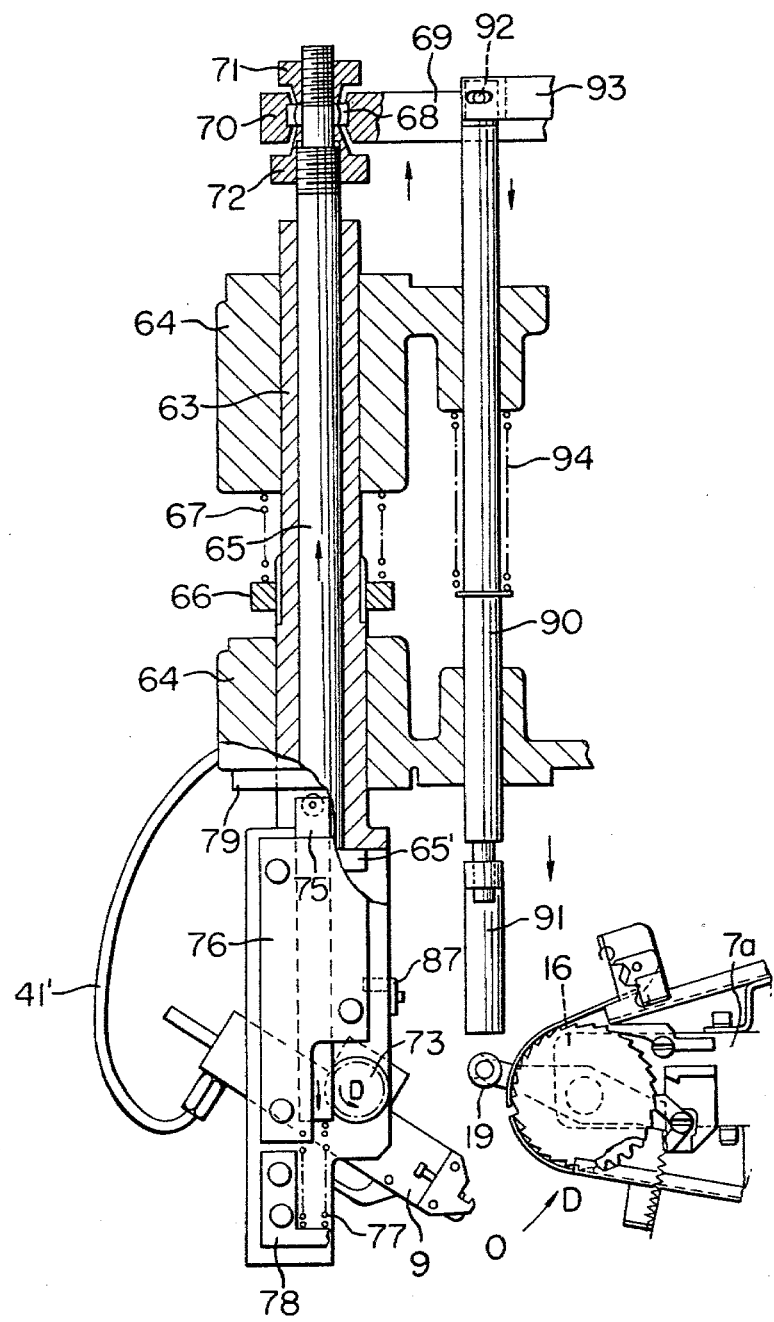
FIG. 13 is a longitudinal sectional view of a lead wire insertion head.

In the insertion step to be described in detail hereinafter, the lever 53 is rotated in the clockwise direction C (See FIG. 12), the holding member 53' is moved away from the component 4 so that the pusher 47 advances the component 4 under the force of the compression spring 48 as shown in FIGS. 11 and 13.

The width m at the leading end of the lead forming member 42 determines the electric component insertion density on a printed circuit board. This width m may be minimized by a suitable selection of the thickness t and t' of the male cutters 50 and 50' relative to the distance between the female cutter 51 and 51'. Furthermore the length of the lead wires cut off may be suitably selected.

Referring to FIG. 11(c), the pusher 47 are formed with U- or V-shaped projections 47a and 47b which mates with the U- or V-shaped guide grooves 45 and 45' of the lead wire forming member 42 when the pusher 42 is advanced so that any foreign matters such as scraps of plating metal and solder which cause the malfunction of the cutter unit 9 may be clearly discharged out of the grooves 45 and 45'.

Referring to FIG. 10, a pinion shaft 73 attached to a bushing 63 is detachably fitted into a hole 61 and securely held in position as a screw 62 is tightened as will be described hereinafter.

Insertion Head 10

Referring to FIGS. 3, 8 and 13-15, the insertion head 10 will be described. The bushing or hollow shaft 63 is vertically slidably mounted on a main body 63, and a drive shaft 66 is slidably fitted into the hollow shaft 63. A compression spring 67 is loaded between the main body and an adjusting nut 66 engaged with externally threaded screws of the hollow shaft 63 intermediate the ends thereof so that the hollow shaft 63 is normally biased downward, but the downward stroke is limited by the engagement of the lower end of the hollow shaft 63 with a stepped portion 65' (See FIG. 15). The upper end of the drive shaft 65 is connected to a head arm 69 with a bearing 68 having a partly spherical bearing surface and upper and lower nuts 71 and 72 screwed over the drive shaft 65 toward each other so as to firmly clamp the inner race 70 of the bearing 68.

Figure 15:
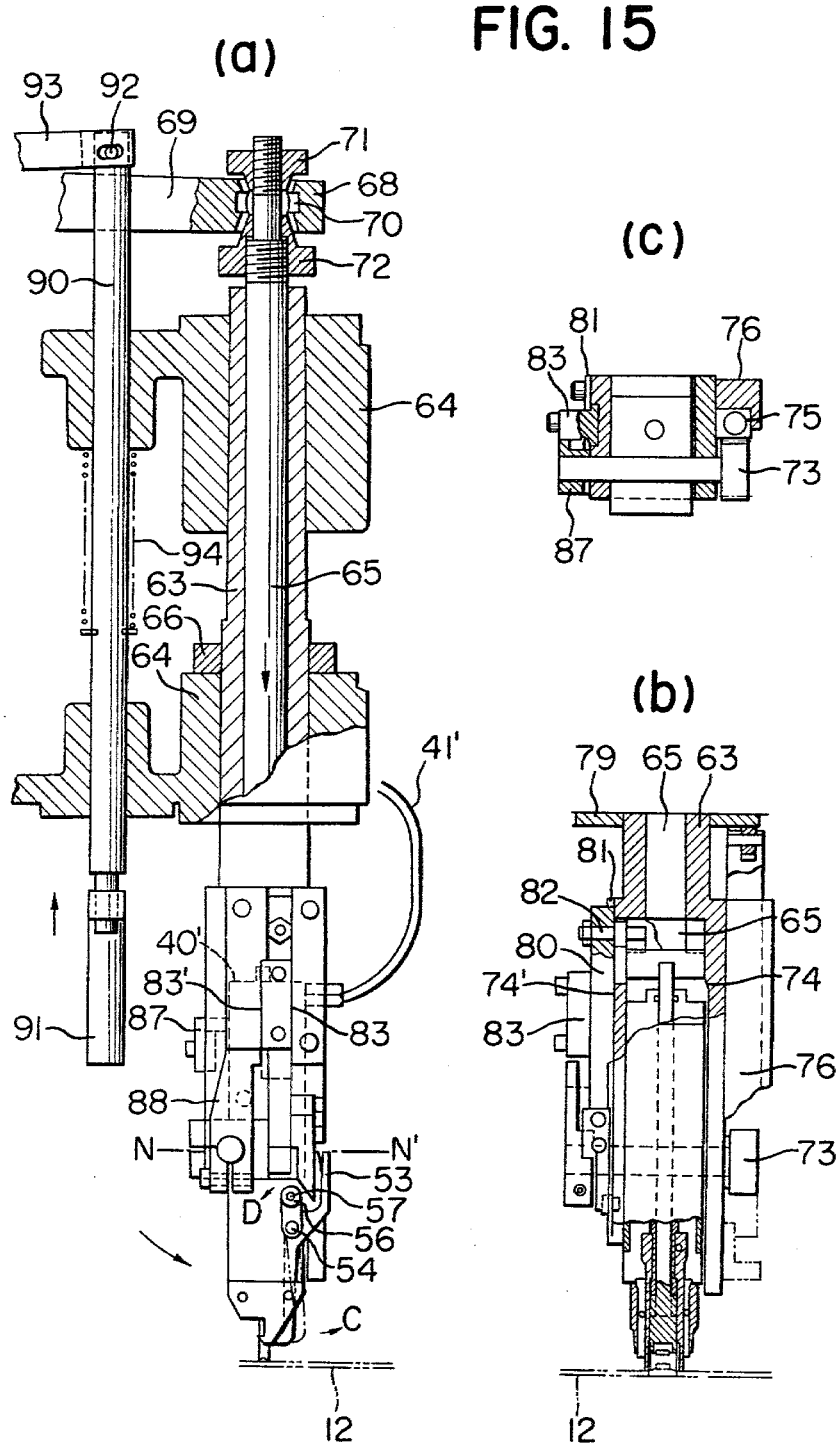
FIG. 15(a) is a side view thereof in the insertion position.
FIG. 15(b) is a front view, partly in section, thereof.
FIG. 15(c) is a sectional view taken along N-N' of FIG. 15(a)

The pinion 73 for rotating the main body 40 of the cutter unit 9 has a shaft formed integral with the pinion and extended between and journalled by flanges 74 and 74' bifurcated from the lower end of the hollow shaft 63 (See FIG. 15). The pinion 73 is in mesh with a slidable rack 75 which is disposed for slidable movement in a groove 76. A compression spring 77 is loaded between the rack 75 and a bracket 78 so that the slidable rack 75 is normally biased upward and pressed against the lower surface 79 of the main body 64. These slidable rack 75 and bracket 78 are mounted on the flange 74 (the right one in FIG. 15b).

A slider block 80 which is connected with a pin 82 to the stepped portion 65' of the drive shaft 65 is slidably fitted into a groove 81 formed in the left flange 74'. Mounted on the slider block 80 are a play limiting block 83 for limiting the play of the cutter unit main body 40 in case of the insertion step and a cam 84 which engages with the holding lever 53 so as to cause it to rotate in the direction C (See FIG. 12). A pair of parallel guard plates 85 and 86 are mounted on the flange 74' in order to confine the slider block 80 within the groove 81.

A stopper 87 is attached to the flange 74' for engagement with the rear end 40' of the main body 40 of the cutter unit 9 when the main body 40 is rotated to the vertical position. A lever 88 which is pivoted to the end of the shaft of the pinion 73 is adjustable by a screw 89 in such a way that the lever 88 is made into engagement with an engaging face 83' of the block 83 with the rear end 40' of the main body 40 of the cutter unit engaged with the stopper 87' immediately after the drive shaft 65 alone starts to move downward after the hollow shaft 63 reaches the limit of its down stroke, whereby the play of the cutter unit 9 may be eliminated.

A drive shaft 90 which is slidably extended through the main body 64 has its upper end pivoted with a pin 92 to one end of the lever 93 and its lower end connected to a block 91 which selectively engages with the roller 56 carried by the lever 18 (See FIG. 4), thereby driving the driving ratchet wheel 16 so that the part tape or belt 6 is advanced by one pitch P. A compression spring 94 is fitted over the drive shaft 90 between the main body 64 and a spring retainer securely attached to the drive shaft 90 so that the drive shaft 90 is normally biased downward.

The other ends of the head lever 69 and feed lever 93 are pivoted with a pivot pinion 96 to a bracket 95 which in turn is attached to the top of the main body 64, and cam followers 97 and 98 are rotatably attached to the head and feed levers 69 and 93 intermediate their ends and are pressed against cams 100 and 101, respectively, carried by a cam shaft 99, whereby the drive shaft 65 and the feed shaft 90 may be vertically reciprocated. The free end of a piston of a cylinder 102 is pivoted to the head lever 69 adjacent to one end thereof so that the positive engagement of the cam follower 97 with the cam 100 may be ensured. In like manner, the coiled spring 94 ensures the positive engagement of the cam follower 98 with the feed cam 101.

Next the mode of operation of the insertion head 10 will be described.

The initial position O of the cutter unit 9 which is inclined downward at an angle 0° to 60° is spaced away from the passage of the part tape feed units 7a (See FIG. 13) so as to avoid the interference between the cutter unit 9 and the part tape feed units 7a. In response to the insertion signal, the cam 100 is driven so that the drive shaft 65 is lifted upward to its upper deap point. Since the hollow shaft 63 is in engagement with the stepped portion of the drive shaft 65, the hollow shaft 63 is also lifted in unison with the drive shaft 65. Since the upper end of the slidable rack 75 is made into engagement with the lower surface 79 of the main body 64, the slidable rack 75 is caused to move downwardly relative to the flange 74 of the hollow shaft 63 which is being lifted so that the pinion 73 in mesh with the rack 75 is caused to rotate in the counterclockwise direction D in FIG. 13 so that the cutter unit 9 is also rotated in the counterclockwise direction to the horizontal operative position when the drive shaft 65 reaches the limit of its upward stroke.

At this position, the air is forced into the cutter unit 9 so that the component 4 is cut off from the part tape or belt 6 and held by the cutter unit 9 with the lead wires 4a and 4b formed in the manner described above (See FIGS. 11, 12 and 14).

Next the drive shaft 65 is reversed to make the downward stroke, and the hollow shaft 63 is also moved downward under the force of the compression spring 67. However the slidable rack 75 which is normally biased upward under the force of the spring 77 moves upward relative to the flange 74 of the hollow shaft 63 so that the pinion 73 is caused to rotate in the clockwise direction E. As a result the cutter unit 9 is caused to rotate also in the clockwise direction to the vertical position with the rear end 40' of the main body 40 made into engagement with the stopper 89. When the hollow shaft 63 is further lowered from this position, the adjusting nut 66 on the hollow shaft 65 engages with the main body 64 so that the further downward stroke of the hollow shaft 63 is not permitted. The position of the adjusting nut 66 is so adjusted that when the nut 66 engages with the main body 64 the leading end of the lead wire forming member 42 is made into engagement with the upper surface of the printed circuit board. Therefore the U- or V-shaped guide grooves 45 and 45' of the lead wire forming member 42 of the cutter unit 9 may be aligned with the predetermined insertion holes in the printed circuit board without the use of any external forces.

After the downward stroke of the hollow shaft 63 is limited, the drive shaft 65 is moved downward and the slider block 80 which is connected with the pin 82 to the drive shaft 65 is caused to move downward in the groove 81 in the flange 74' of the hollow shaft 63. As the slider block 80 is moved downward, the limiting surface of the block 83 immediately engages with the lever 87 so that the cutter unit 9 is locked securely in position without any play. The cam surface 84' of the cam 84 engages with the roller 56 of the holding lever 53 so that the lever 53 is caused to rotate in the direction C (See FIG. 15a), whereby the part holding end of the lever 53 is moved away from the component 4 (See FIGS. 11 and 12).

Then under the force of the compression spring 48 the pusher 47 is moved downward, whereby the component 4 is ejected with its lead wires 4a and 4b guided by the U- or V-shaped guide grooves 45 and 45' and insertion into the predetermined apertures in the printed circuit board. In order to ensure the positive ejection, the stepped portion 65' of the drive shaft 65 keeps pressing the rear end of the pressure rod 46.

When the drive shaft 65 reaches the limit of its downward stroke, the air in the cylinder 41 in the cutter unit main body 40 is discharged so that the piston is returned to its initial position. The drive shaft 65 is reversed and moved upward, and after the engagement of the stepped portion 65' of the drive shaft 65 with the hollow shaft 63, they are moved upward in unison. The cutting unit 9 is returned to the initial position O, and one cycle for inserting the lead wires or legs of the electrical component 4 into the predetermined apertures of the printed circuit board 12 is completed.

Anvil Unit 200

Figure 16:
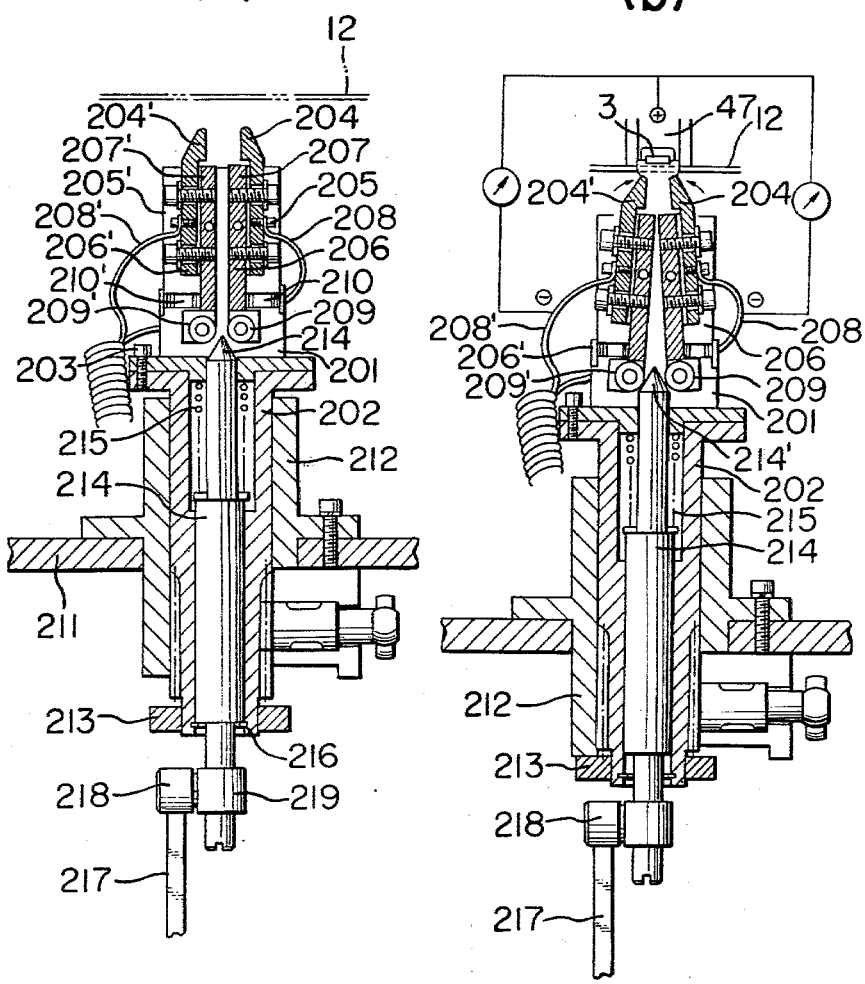
FIG. 16(a) is a longitudinal sectional view of an anvil unit.
FIG. 16(b) is a longitudinal sectional view, on enlarged scale, thereof in the clinching and insertion detection position.
Figure 17:
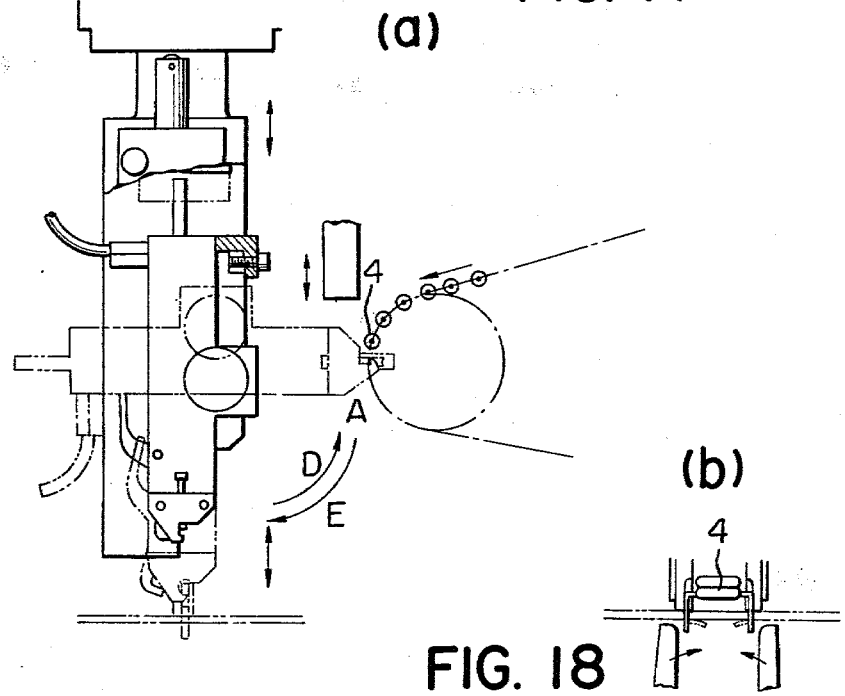
FIG. 17(a) is a schematic view used for the explanation of the insertion cycle.
FIG. 17(b) shows a pair of clinching pawls of the anvil unit in the clinching position.

Referring to FIGS. 16a, 16b and 17, an anvil flange 201 is mounted with screws 203 on the top of an outer hollow shaft 202 which is slidably fitted into a lower flange 212 anchored to a base 211. A pair of clinching pawls 204 and 204' are attached to the upper ends of levers 206 and 206' pivoted with pivot pins 205 and 205' to the upper flange 201 and are electrically isolated from the levers 206 and 206' with insulating members 207 and 207'. The clinching pawls 204 and 204' are connected through conductors 208 and 208' to the negative terminal of a battery. Clinching rollers 209 and 209' are rotatably attached to the lower ends of the clinching levers 206 and 206', which are loaded with return springs 207 and 207' so that the clinching pawls 204 and 204' are normally spaced apart from each other as best shown in FIG. 16(a). A stopper 213 is attached to the outer hollow shaft 202 adjacent to the lower end thereof in order to limit the upward stroke.

An inner shaft 214 is slidably extended through the outer hollow shaft 202, and a compression spring 215 is fitted over the upper reduced diameter portion of the inner shaft 214 between the lower end of the upper flange 201 and the stepped portion of the inner shaft 214. The upper end 214 of the inner shaft 214 is tapered and spaced apart from the rollers 209 and 209' by a small distance. A stop ring 216 is attached to the lower end of the large diameter portion of the inner shaft 214 and is engaged with the outer hollow shaft 202 so that the inner shaft 214 may lift the outer hollow shaft in the upward stroke. A cam follower roller 218 which is made into contact with an anvil cam 217 is rotatably supported by a bracket 219 which in turn is securely attached to the inner shaft 214 adjacent the lower end thereof.

Figure 18:
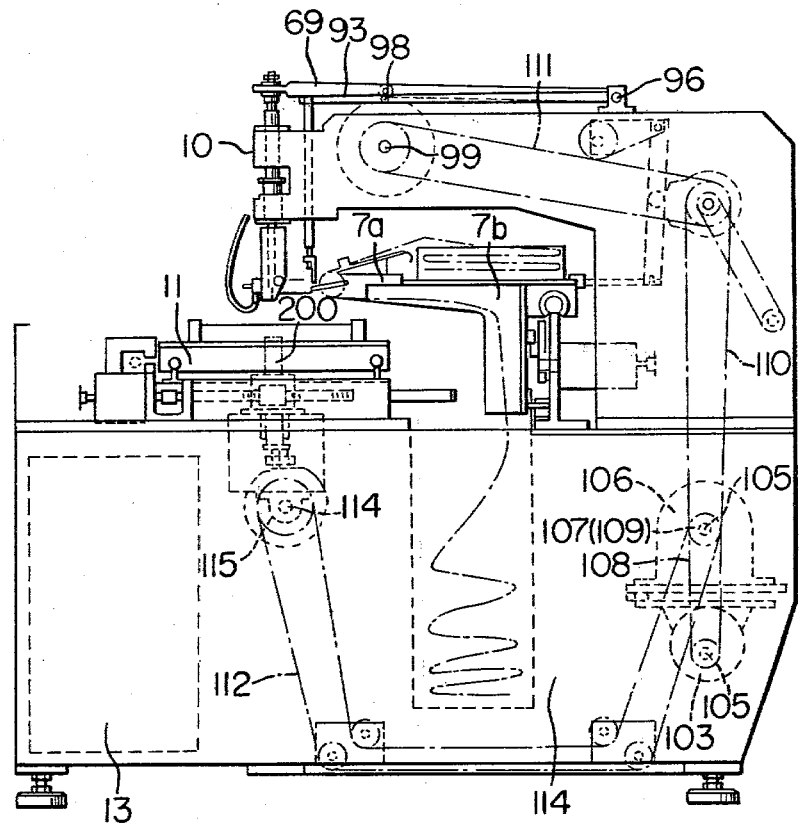
FIG. 18 is a side view of the part insertion apparatus in accordance with the present invention illustrating a drive system.

A shaft (not shown) of the anvil cam 217 is drivingly coupled to a motor 10 with a reduction gear (See FIG. 18). Upon rotation of the anvil cam 217 the inner shaft 214 is moved upwardly so that the outer shaft 202 and the upper flange 201 are also moved upward until the stopper 213 engages with the lower end of the lower flange 212 when the clinching pawls 204 and 204' engages with the undersurface of the printed circuit board 12. Even after the upward stroke of the upper flange 201 and the outer shaft 202 is limited, the inner shaft 214 is further moved upward, compressing the compression spring 215 so that the tapered upper end 214' of the inner shaft is forced to enter between the rollers 209 and 209', thereby moving them away from each other. As a result the clinching pawls 204 and 204' are formed to move each other in the directions indicated by arrows in FIG. 16(b) so that the lead wires 4a and 4b extended downward from the circuit board 12 are forced to clinch to the board 12.

The operation of the anvil unit 200 described above is of course correctly timed with the operation of the insertion head 10 so that after the lead wires 4a and 4b have been inserted through the predetermined apertures in the printed circuit board 12, they are clinched by the clinching pawls 204 and 204'.

The pusher 47 of the cutter unit 9 is connected to the positive terminal of the battery so that when the clinching pawls 104 and 104' touch the lead wires 4a and 4b, the electric current flows through them, whereby the insertion of the lead wires may be electrically confirmed.

Drive Unit

Referring to FIG. 18, the motor 103 with the reduction gear is mounted on the main frame 104 of the electric component assembling apparatus and is normally continuously driven during the operation.

The input shaft of a brake-clutch unit 106 which is mounted on the main frame 104 carries a sprocket wheel 107 which in turn is drivingly coupled with an endless chain 108 to the output shaft of the motor 103. The output shaft of the brake-clutch unit 106 which is selectively connected to the input shaft thereof in response to the insertion instruction transmitted from the control unit 13, carries a sprocket wheel 109 which is drivingly coupled with endless chains 110 and 111 to a sprocket wheel 113 carried by the cam shaft 99 (See also FIG. 8) and with an endless chain 112 to a sprocket wheel 115 carried by the anvil cam shaft 114.

In response to the insertion instruction from the control unit 13, the clutch-brake unit 106 engages the clutch and releases the brake so that the rotation of the motor 103 is transmitted to the cam shaft 99 and the anvil cam shaft 114, whereby the part tape feed unit 7a at the feed position, the insertion head 10 including the cutter unit 9 and the anvil unit 200 are operated in the manner described above.

As shown in FIG. 19, the control unit 13 controls the clutch-brake unit 106 so as to release its clutch but to apply brake so that the rotations of the cam shafts 99 and 114 may be stopped until the board positioning device 11 has brought the predetermined apertures to the component insertion position immediately below the insertion head 10 and/or the desired part tape feed unit 7a has been brought to the feed position.

Board Positioning Device 11

The printed circuit board positioning device 11 is mounted on a base 125 which in turn is mounted on the main boty 29 of the electrical component assembling apparatus. A Y-table is slidably mounted on Y-slide shafts 126 which in turn are mounted on the base 125. A Y-pulse motor 128 is mounted on the base 125 and has its output shaft connected to a threaded rod 129 which in turn is threadably engaged with a nut 130 securely attached to the Y-table 127. An X-table 132 is slidably mounted on X-slide shafts 131 securely mounted on the Y-table 127 in the X-direction, and an X-pulse motor 133 which is mounted on the Y-table 127 has its output shaft connected to a threaded rod 134 which in turn is threadably engaged with a nut 135 securely attached to the X-table 132. The mode of operation of the printed circuit board positioning device 11 with the above construction is apparent to those skilled in the art so that no further description may be needed.

Timing Chart, FIG. 19

FIG. 19 shows the timing chart of one cyclic operation. When the insertion cycle is stated at 0°, the printed circuit board 12 have been already brought to predetermined position by the movements of the X- and Y-tables 127 and 132. The movable part stock station has been so moved that the desired part tape feed unit 7a has been brought to the feeding position, and the component 4 to be assembled has been brought to the position spaced apart from the lead wire cutting position A by the pitch P. The cutter unit 9 remains in initial position O with the cylinder 41 kept de-energized.

In response to the component insertion signal, the X- and Y-tables 127 and 132 are moved by the X- and Y-pulse motors so that the predetermined apertures of the printed circuit board 12 may be brought to the insertion position B. The cutter unit 9 is also immediately brought to the horizontal position while the pushing rod 90 is moved downward so that the pusher 91 at the lower end of the push rod 90 pushes downward the roller 19 carried at the other end of the lever 18. Therefore the part tape or belt 6 is advanced by one pitch P in the manner described above so that the component 4 is brought to the X—X line.

Thereafter the cutter unit 9 is actuated in the manner described above so that the component 4 is separated from the part tape or belt 6 and the lead wires 4a and 4b are formed and retained in insertion ready position in the manner described above. Next the cutter unit 9 is brought to the vertical position away from the passage of the part tape feed units 7a. Then the movable stock station is moved lenthwise in either direction so that the next desired part tape feed unit 7a may be brought to the feeding position. If the component 4 to be inserted in the next cycle is same as in this cycle, the movable part stock station remains stationary.

The printed circuit board 12 has been moved in the X- and Y-directions so that the predetermined apertures have been already brought to the insertion position. Then the insertion head 10 is operated so that the component 4 is ejected and the lead wires 4a and 4b are inserted into the predetermined apertures in the manner described above. Thereafter the cutter unit 9 is returned to its initial position O. Thus one cycle is completed.

As described above, according to the present invention it is not necessary at all to arrange a large number of electric and electronic components of various types according to a predetermined insertion sequence. As a result, sequencing machines and retaping steps may be eliminated. Since the components are directly cut off from the tapes and are not released, the prior art part transfer station may be eliminated so that the electric component insertion apparatus of the present invention is completely free from the malfunction of this station. Furthermore the insertion sequence is very simple and consists of only the steps of rotating the cutter unit, cutting off the lead wires from the tapes and forming them, rotating again the cutter unit and inserting the formed lead wires into the predetermined apertures in the printed circuit board. Therefore the method and apparatus of the present invention will greatly contribute to the increase of the assembling speed. Moreover the component to be inserted is selected from the stock station so that when a failure in insertion occurs, the insertion of the component of the same type may be recycled again in a very simple manner.

We claim:

1. An electric part insertion apparatus comprising
 a part tape or belt feed unit for effecting intermittent feed to a predetermined lead wire cutting position a tape or belt holding a large number of electric parts of the same type each of which has lead wires extended in opposite directions and coaxially of a main body of said part and attached adjacent to their ends to parallel strips of tape or belt in equidistantly spaced apart relationship with the lead wires of the adjacent parts,
 a lead wire cutter unit which is movable between said lead wire cutting position and a lead wire insertion position where the lead wires of the electric part are inserted into predetermined apertures in a printed circuit board and which cuts the lead wires of the electric part from said strips of tape or belt, thereby separating the electric part from said part tape or belt and bends the lead wires of the electric part in the same direction in parallel with the axis of said cutter unit,
 a piston slidably disposed within said cutter unit, said cutter unit including:
  cutter means for cutting off the lead wires of the electric part at the positions spaced apart from the ends of said main body of said electric part by a predetermined distance,
  lead wire retaining means for retaining the cut off lead wires adjacent to the ends of said main body of said electric part, and
  lead wire forming means movable relative to said lead wire retaining means for bending said lead wires in the same direction, said lead wire forming means being disposed on both ends of said lead wire retaining means and being connected to said piston slidably disposed within said cutter unit, said cutter means being disposed on both sides of said lead wire forming means and comprising a movable male cutter having a suitable thickness and movable in unison with said lead wire forming means, and a stationary female cutter in operative engagement with said movable male cutter for cutting off the lead wire of the electric part, said lead wire forming means and said movable male cutter being directly coupled through a ball clutch means in such a way that when said piston connected to said lead wire forming means is displaced a predetermined distance so that said male and female cutters cut off the lead wire, said ball clutch means is released from said male cutter so that only said lead wire forming means is further advanced a predetermined distance,
 a lead wire insertion head including electric part pushing means for pushing the electric part toward the printed circuit board when said cutter unit is brought to said lead wire insertion position, and
 a printed circuit board positioning device for supporting the printed circuit board and moving it in the X- and Y- directions so that the predetermined apertures may be brought to said lead wire insertion position.

2. An electric part insertion apparatus comprising
 a part tape or belt feed unit for effecting the intermittent feed to a predetermined lead wire cutting position a tape or belt holding a large number of electric parts of the same type each of which has lead wires extended in opposite directions and coaxially of a main body of said part and attached adjacent to their ends to parallel strips of tape or belt in equidistantly spaced apart relationship with the lead wires of the adjacent parts,
 a lead wire cutter unit which is movable between said lead wire cutting position and a lead wire insertion position where the lead wires of the electric part are inserted into predetermined apertures in a printed circuit board and which cuts the lead wires of the electric part from said strips of tape or belt, thereby separating the electric part from said part tape or belt and bends the lead wires of the electric part in the same direction in parallel with the axis of said cutter unit,
 a lead wire insertion head including electric part pushing means capable of vertical reciprocal movement for pushing the electric part toward the printed circuit board when said cutter unit is brought to said lead wire insertion position,
 a drive shaft extending through said lead wire insertion head,
 a printed circuit board positioning device for supporting the printed circuit board and moving it in the X- and Y- directions so that the predetermined apertures may be brought to said lead wire insertion position,
  said cutter unit including a pusher which pushes the shoulders of the bent lead wires when the electric part is pushed out of said cutter unit, said cutter unit being mounted on said lead wire insertion head in such a way that said cutter unit is movable between a horizontal position and a vertical position, said cutter unit being connected to said drive shaft in such a way that the vertical reciprocal movement of said drive shaft causes said movement of said cutter unit between said horizontal position and vertical position, said drive shaft being operatively coupled to said pusher when said cutter unit is brought to said vertical position.

3. An electric part insertion apparatus comprising a part tape or belt feed unit for effecting the intermittent feed to a predetermined lead wire cutting position of a tape or belt holding a large number of electric parts of the same type, each of said parts having lead wires extending in opposite directions from a main body of said part, said lead wires being attached adjacent the ends thereof to parallel strips of tape or belt in equidistantly spaced apart relationship, means for transmitting said electric parts to said lead wire cutting position one by one, said means comprising an incrementally movable table upon which are mounted a plurality of part tape or belt feed units and which is movable in any direction in a plane in such a way that the desired part tape or belt feed unit may be brought to an electric part feed position at which said desired part tape or belt feed unit feeds the electric part to said lead wire cutting position, a cutter unit comprising a cutter unit body rotatably pivoted to a horizontal shaft, a cutter for cutting the lead wires of the part off from said part tape or belt, thereby separating therefrom said part having lead wires of a predetermined length, lead wire retaining means for retaining said lead wires adjacent the body of the electric part, lead wire forming means relatively movable with respect to said retaining means for bending the lead wires in the same direction, and a pusher for pushing said formed electric parts into predetermined apertures in a printed circuit board, means for rotating said cutter unit about said horizontal shaft between forming and inserting positions and for displacing the electric parts from the position for cutting the lead wires to a position adjacent the printed board, > a movable table for holding and moving said printed board to a desired position within a horizontal plane, said cutter being positioned adjacent predetermined apertures of said printed board at the position for inserting said electric parts, and an anvil unit disposed below said printed circuit board and immediately below said lead wire insertion position in vertical alignment therewith for clinching against the undersurface of said printed circuit board the lead wires extended downward through said predetermined apertures in said printed circuit board.

4. An electric part insertion apparatus as set forth in claim 3 wherein

> the retaining means of said cutter unit is rotatably pivoted to the cutter unit body and the lead wires are supported in the opposite side of the pusher and are caught between said pusher and a lead wire retaining lever, and means for removing said lever from the moving locus of said electric parts after insertion thereof in the apertures of said printed circuit board.

5. An electric part insertion apparatus as set forth in claim 3 wherein

> said lead wire forming means are disposed on both ends of said lead wire retaining means and are slidably connected to the cutter unit and said cutter consists of a male cutter disposed in the position attached to the outer side of the lead wire forming means and a female cutter fixed to the cutter unit body, said lead wire forming means and said male cutter being coupled through a ball clutch, said ball clutch being released in the position cutting off the lead wire by said male and female cutter due to displacing means for operating said lead wire forming means in a predetermined distance, only said lead wire forming means being further advanced a predetermined distance.

6. An electric part insertion method comprising the steps of providing a plurality of part tapes or belts each holding a large number of electric parts of the same type each of which has lead wires extended in opposite directions and coaxially of a main body of said electric part and attached adjacent to their ends to spaced parallel strips of tape or belt in equidistantly spaced apart relationship with the lead wires of the adjacent electric parts, > selectively bringing the desired part tape or belt to an electric part feed position in line with a lead wire cutting position, cutting off from the tape or belt at said lead wire cutting position the lead wires of an electric part while retaining the lead wires adjacent the main body of the electric part, thereby separating from said tape or belt said electric part having lead wires having a predetermined length,
> bending the lead wires of the electric part in the same direction while retaining said lead wires thereby forming shoulders on the wires,
> displacing said electric part, while retaining the lead wires thereof, to a lead wire insertion where said lead wires are directed to a printed circuit board,
> moving said printed circuit board in the X- and Y-directions so that predetermined apertures thereof may be brought to said lead wire insertion position,
> pushing the shoulders of said bent lead wires of the electric part, thereby inserting the lead wires into said predetermined apertures of said printed circuit board, and
> clinching to the undersurface of said printed circuit board the lead wires extended downward through said predetermined apertures.

7. An electric part insertion method as set forth in claim 6 wherein means for cutting the lead wires of the electric part is moved away from the passage of said plurality of part tapes or belts to said part feed position and is then brought to said lead wire cutting position after the desired tape or belt has been brought to said part feed position.

8. An electric part insertion apparatus comprising a plurality of part tape or belt feed units each for effecting the intermittent feed to a predetermined lead wire cutting position a tape or belt holding a large number of electric parts of the same type each of which has lead wires extended in opposite directions and coaxially of a main body of the electric part and attached adjacent to their ends to parallel strips of tape or belt in equidistantly spaced apart relationship with the lead wires of the adjacent parts, > a sliding or movable table upon which are mounted said plurality of part tape or belt feed units and which is movable in either direction in such a way that the desired part tape or belt feed unit may be brought to an electric part feed position at which said desired part tape or belt feed unit feeds the electric part to said lead wire cutting position,
> a cutter unit which is movable between said lead wire cutting position and a lead wire insertion position at which the lead wires of the part are inserted into predetermined apertures in a printed circuit board and which includes
>> a retaining lever and a pusher which cooperate so as to clamp the lead wires adjacent to the ends of said main body of the electric part,
>> cutting means for cutting the lead wires of the part off from said part tape or belt, thereby separating therefrom said part having the lead wires of a predetermined length, and
>> lead wire forming means for bending the lead wires in the same direction at positions outwardly of the clamped positions,
>> said lead wire forming means being formed with guide grooves which retain and guide said bent lead wires toward said predetermined apertures and into which are slidably fitted guides formed integral with said pusher so that when said guides slide through said guide grooves, foreign matters therein are ejected out of it, said pusher being so constructed and arranged as to push the shoulder portions of said bent lead wires when the lead wires are inserted into said predetermined apertures in said printed circuit board, a lead wire insertion head upon which is mounted said cutter unit in such a way that said cutter unit may be movable between said lead wire cutting position and said lead wire insertion position and which includes a drive shaft which imparts the pushing force to said pusher when said cutter unit has been brought to said lead wire insertion position, a rack and pinion mechanism for converting vertical reciprocal movement of said drive shaft into rotational movement of said cutter unit between said lead wire cutting position and said lead wire insertion position, a stopper for engagement with said cutter unit, thereby holding it in said lead wire insertion position, a printed circuit board positioning device for supporting said printed circuit board and moving it in the X- and Y-directions so that said predetermined apertures may be brought to said lead wire insertion position, and an anvil unit disposed below said printed circuit board and immediately below said lead wire insertion position in line therewith for clinching against the undersurface of said printed circuit board the lead wires extended downward through said predetermined apertures in said printed circuit board.

* * * * *

UNITED STATES PATENT OFFICE
CERTIFICATE OF CORRECTION

Patent No. 4,205,433          Dated  June 3, 1980

Inventor(s)  Shigeru Araki, et al

It is certified that error appears in the above-identified patent and that said Letters Patent are hereby corrected as shown below:

In the drawings, in Figure 19B: "VERTICAL RECIPROCAL MOVEMEN OF ANVIL UNIT" should be --VERTICAL RECIPROCAL MOVEMENT OF ANVIL UNIT--.

Column 12, line 5: "boty" should be --body--.

line 53: "lenthwise" should be --lengthwise--.

Signed and Sealed this

Eighteenth Day of November 1980

[SEAL]

Attest:

SIDNEY A. DIAMOND

Attesting Officer                Commissioner of Patents and Trademarks